United States Patent
Watanabe

(10) Patent No.: US 10,607,966 B2
(45) Date of Patent: *Mar. 31, 2020

(54) STACKED SEMICONDUCTOR DIES WITH SELECTIVE CAPILLARY UNDER FILL

(71) Applicant: Micron Technology, Inc., Boise, ID (US)

(72) Inventor: Mitsuhisa Watanabe, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/109,698

(22) Filed: Aug. 22, 2018

(65) Prior Publication Data

US 2018/0366448 A1 Dec. 20, 2018

Related U.S. Application Data

(60) Continuation of application No. 15/901,799, filed on Feb. 21, 2018, which is a division of application No. 14/982,196, filed on Dec. 29, 2015, now Pat. No. 9,935,082.

(51) Int. Cl.
| | |
|---|---|
| *H01L 25/18* | (2006.01) |
| *H01L 25/065* | (2006.01) |
| *H01L 23/31* | (2006.01) |
| *H01L 25/00* | (2006.01) |
| *H01L 21/56* | (2006.01) |
| *H01L 21/78* | (2006.01) |

(52) U.S. Cl.
CPC ........ *H01L 25/0657* (2013.01); *H01L 21/561* (2013.01); *H01L 21/563* (2013.01); *H01L 21/565* (2013.01); *H01L 21/78* (2013.01); *H01L 23/3142* (2013.01); *H01L 25/18* (2013.01); *H01L 25/50* (2013.01); *H01L 2224/16145* (2013.01); *H01L 2224/73204* (2013.01); *H01L 2224/97* (2013.01); *H01L 2225/06565* (2013.01)

(58) Field of Classification Search
None
See application file for complete search history.

(56) References Cited

U.S. PATENT DOCUMENTS

| | | |
|---|---|---|
| 7,973,310 B2 | 7/2011 | Wang et al. |
| 8,138,023 B2 | 3/2012 | Egawa |
| 8,294,281 B2 | 10/2012 | Yoshida et al. |
| 8,633,598 B1 | 1/2014 | St Amand et al. |
| 8,647,924 B2 | 2/2014 | Toh et al. |

(Continued)

FOREIGN PATENT DOCUMENTS

JP 2012209449 10/2012

*Primary Examiner* — Michael Lebentritt
(74) *Attorney, Agent, or Firm* — Perkins Coie LLP

(57) ABSTRACT

Stacked semiconductor dies are provided with selective capillary under fill to avoid wafer warpage during curing. In one embodiment, a method of manufacturing a semiconductor device includes forming at least three stacks of semiconductor dies over a substrate, the stacks spaced apart from one another by gaps. A first sealing material such as a capillary under fill material is deposited into a first subset of the gaps. A second sealing material such as a mold resin is deposited into a second subset of the gaps. The first and second sealing materials are cured, and the die stacks are then singulated.

9 Claims, 9 Drawing Sheets

(56) References Cited

U.S. PATENT DOCUMENTS

| | | |
|---|---|---|
| 8,653,676 B2 | 2/2014 | Kim et al. |
| 8,786,102 B2 | 7/2014 | Yoshida et al. |
| 9,508,648 B2 | 11/2016 | Kawase et al. |
| 9,935,082 B2 * | 4/2018 | Watanabe ............ H01L 23/3142 |
| 2004/0150118 A1 | 8/2004 | Honda et al. |
| 2006/0131740 A1 | 6/2006 | Kawabata et al. |
| 2010/0148340 A1 | 6/2010 | Takano et al. |
| 2010/0261311 A1 | 10/2010 | Tsuji et al. |
| 2012/0256310 A1 | 10/2012 | Ide et al. |
| 2012/0306074 A1 | 12/2012 | Kobayashi et al. |
| 2013/0214427 A1 | 8/2013 | Nakanoya et al. |
| 2017/0018533 A1 | 1/2017 | Miki et al. |
| 2017/0047232 A1 | 2/2017 | Glascock et al. |
| 2017/0186729 A1 | 6/2017 | Watanabe |
| 2018/0182738 A1 | 6/2018 | Watanabe |

\* cited by examiner

STACKED SEMICONDUCTOR DIES WITH SELECTIVE CAPILLARY UNDER FILL

CROSS-REFERENCE TO RELATED APPLICATIONS

This application is a continuation of U.S. application Ser. No. 15/901,799, filed Feb. 21, 2018; which is a divisional of U.S. application Ser. No. 14/982,196, filed Dec. 29, 2015, now U.S. Pat. No. 9,935,082; each of which is incorporated herein by reference in its entirety.

TECHNICAL FIELD

The disclosed embodiments relate to semiconductor devices and more particularly to wafer-level processing of semiconductor devices.

BACKGROUND

Electronic products require semiconductor devices to have an extremely high density of components in a very limited space. For example, the space available for memory devices, imagers, processors, displays, and other microelectronic components is quite limited in cell phones, PDAs, portable computers, and many other products. As such, there is a strong drive to reduce the surface area or "footprint" of the device on a printed circuit board or other mounting surface. One technique used to increase the density of semiconductor dies within a given footprint is to stack one semiconductor die on top of another.

Stacked semiconductor devices are often manufactured on semiconductor workpieces or other types of workpieces. In a typical application, several stacks of dies (e.g., devices) are fabricated on a single workpiece using sophisticated and expensive equipment and processes. The individual stacks of dies are then separated by dicing or otherwise singulating the stacks from the wafer. The gaps between adjacent stacked dies are often filled using a capillary under fill (CUF) material that is cured before singulating the stacked dies from the wafer. In many cases, curing the CUF material results in wafer warpage, thereby impairing singulation and subsequent processing of the stacked dies.

DETAILED DESCRIPTION

Specific details of several embodiments of stacked semiconductor dies having one or more sides at least partially covered with a first sealing material and other sides covered with a second sealing are described below along with associated systems and methods therefor. The term "semiconductor die" generally refers to a die having integrated circuits or components, data storage elements, processing components, and/or other features manufactured on semiconductor substrates. For example, semiconductor dies can include integrated circuit memory and/or logic circuitry. A person skilled in the relevant art will also understand that the technology may have additional embodiments, and that the technology may be practiced without several of the details of the embodiments described below with reference to FIGS. 1A-6.

As used herein, the terms "vertical," "lateral," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1A:
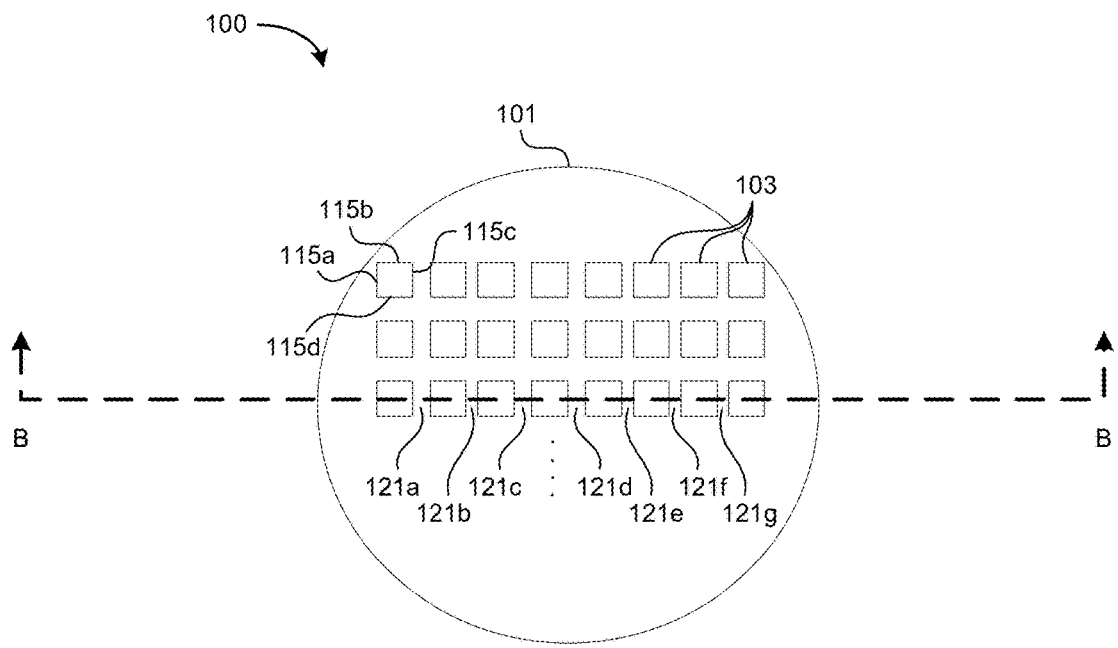
FIGS. 1A-1H are top plan and cross-sectional views of an assembly comprising a wafer having a plurality of stacks of semiconductor dies thereon at various stages of processing in accordance with an embodiment of the present technology.
Figure 1B:
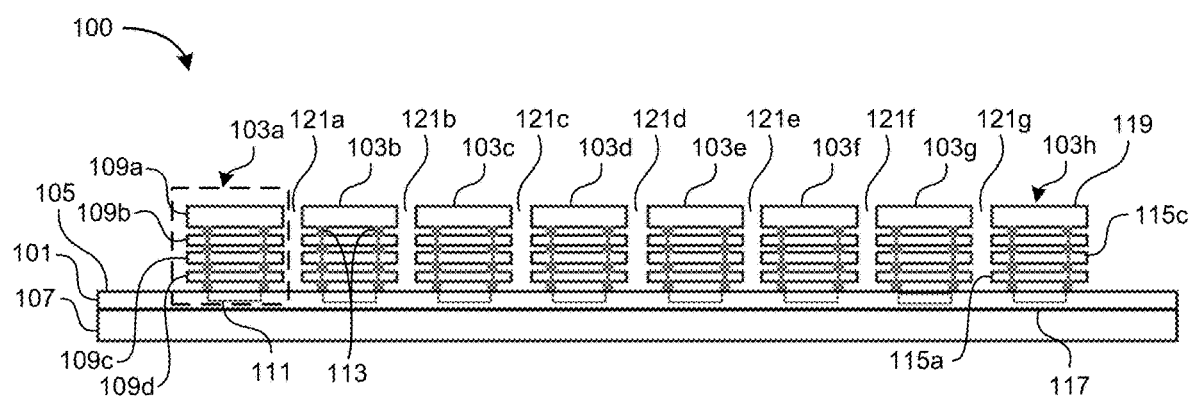

FIGS. 1A-1H are top plan and cross-sectional views of an assembly 100 comprising a wafer 101 having a plurality of stacks 103 (identified individually as 103a-h in FIG. 1B) of semiconductor dies thereon at various stages of processing in accordance with an embodiment of the present technology. FIG. 1A is a top plan view of the assembly 100, and FIG. 1B is a cross-sectional view of the assembly 100 taken along line B-B in FIG. 1A. Referring to FIGS. 1A and 1B together, the stacks 103 are arranged in an array across the upper surface 105 of the wafer 101. The wafer 101 can be, for example, a silicon wafer. In the illustrated embodiment, the array can have multiple rows with each row having eight stacks 103a-h across the surface of the wafer 101, however in other embodiments the number of stacks 103 can vary. The wafer 101 is disposed over and supported by a support substrate 107. The support substrate 107 is thicker than the wafer 101 and provides structural support and rigidity to the wafer 101 during processing.

In the illustrated embodiment, each individual stack 103 includes four semiconductor dies 109a-d stacked vertically on top of one another. In some embodiments, the semiconductor dies 109a-d can include memory chips, interface chips, or other types of chips. The illustrated semiconductor dies 109a-d have substantially identical dimensions, however in other embodiments the individual dies 109a-d can vary from each other in footprint, thickness, shape, or other dimensions. The four semiconductor dies 109a-d are stacked over a logic circuit 111 which is formed in or on the wafer 101 and the logic circuit 111 is in electrical communication with the semiconductor dies 109a-d using, for example, the through-silicon vias (TSVs) 113 that extend through the semiconductor dies 109a-d. In other embodiments various other types of interconnects can be used. Although the stacks 103 shown in FIG. 1B each include four semiconductor dies 109a-d, in other embodiments there may be fewer or greater numbers of semiconductor dies, for example two to twelve and any integer thereof, or more semiconductor dies can be stacked over one another.

In the illustrated embodiment, each stack 103 defines a substantially rectangular geometric prism having side surfaces 115a-d (FIG. 1A), a lower surface 117 (FIG. 1B) adjacent to the logic circuit 111, and an upper surface 119 (FIG. 1B) opposite the lower surface 117. Adjacent stacks 103 are laterally separated from one another by a plurality of gaps 121a-g (collectively "gaps 121"); for example the first stack 103a is separated from the second stack 103b by the first gap 121a. Although the gaps 121a-g are illustrated in one cross-sectional dimension, similar gaps separate each stack 103n from adjacent stacks in the perpendicular direction (i.e., gaps separating each stack 103 from stacks in adjacent rows).

Figure 1C:
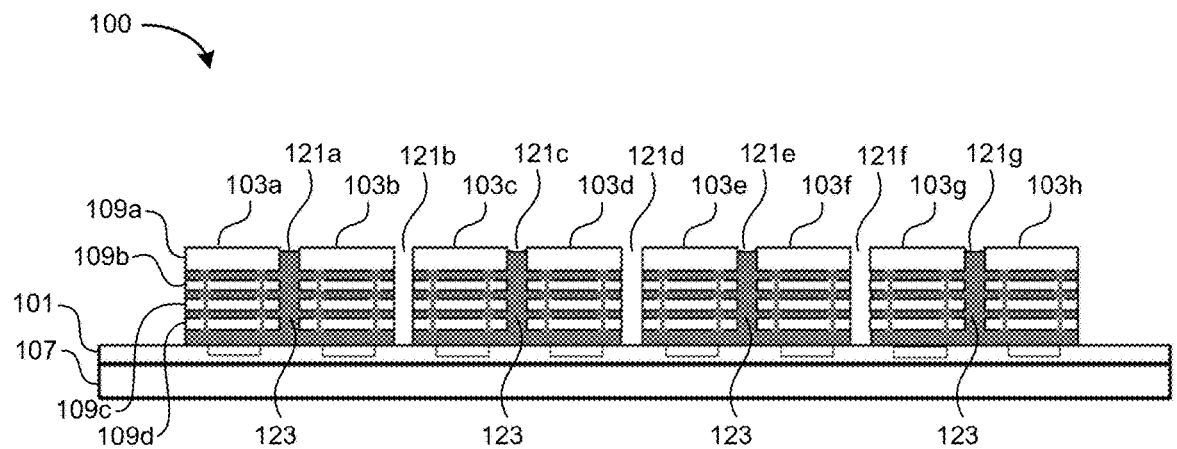
Figure 1D:
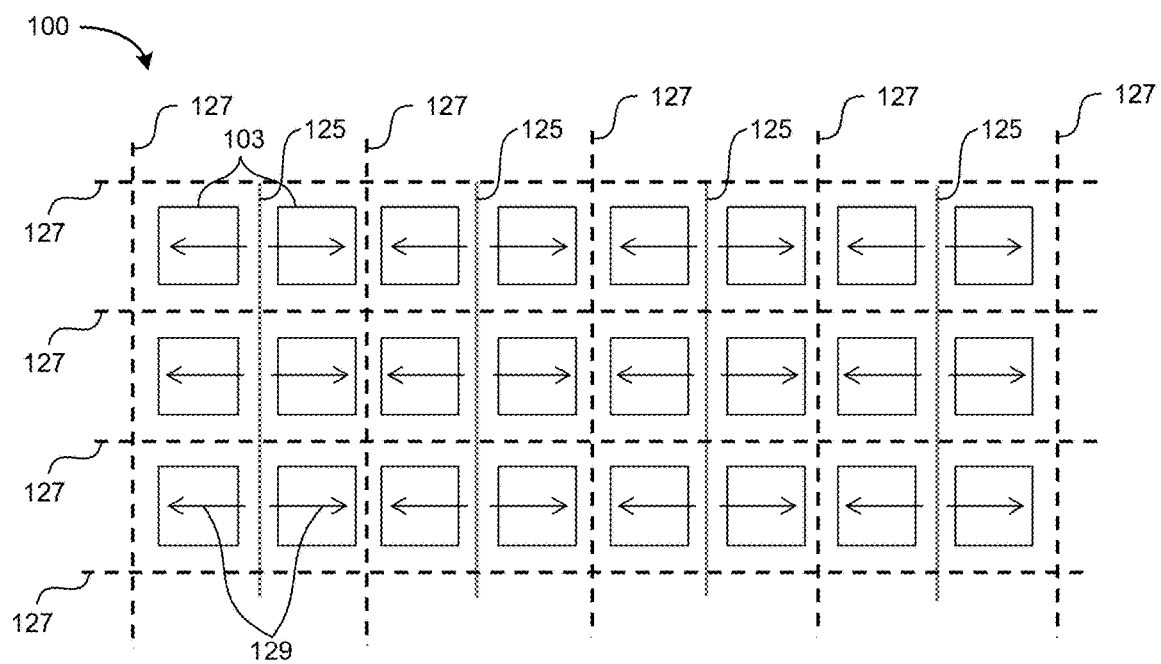

FIG. 1C is a cross-sectional view of the assembly 100 after a first sealing material 123 has been dispensed into a subset of the gaps 121 between adjacent stacks 103. The first sealing material 123 can be, for example, a capillary under fill (CUF) material dispensed from a capillary. FIG. 1D is a top plan view of a portion of the assembly 100 in which the first sealing material 123 is dispensed along lines 125 and is not dispensed along lines 127. Arrows 129 (FIG. 1) indicate the direction of flow of the first sealing material 123 from the dispenser. Referring to FIGS. 1C and 1D together, the movement of the dispenser to deposit the first sealing material 123 along lines 125 results in first sealing material 123 filling in the space between individual semiconductor dies 109a-d in each of the stacks 103, as well as filling in the gaps 121 into which the first sealing material is dispensed. In the illustrated embodiment, the dispenser deposits the first sealing material 123 into a first subset of the gaps 121 including gaps 121a, 121c, 121e, and 121g, but not in a second subset of the gaps 121 including gaps 121b, 121d, and 121f.

Figure 1E:
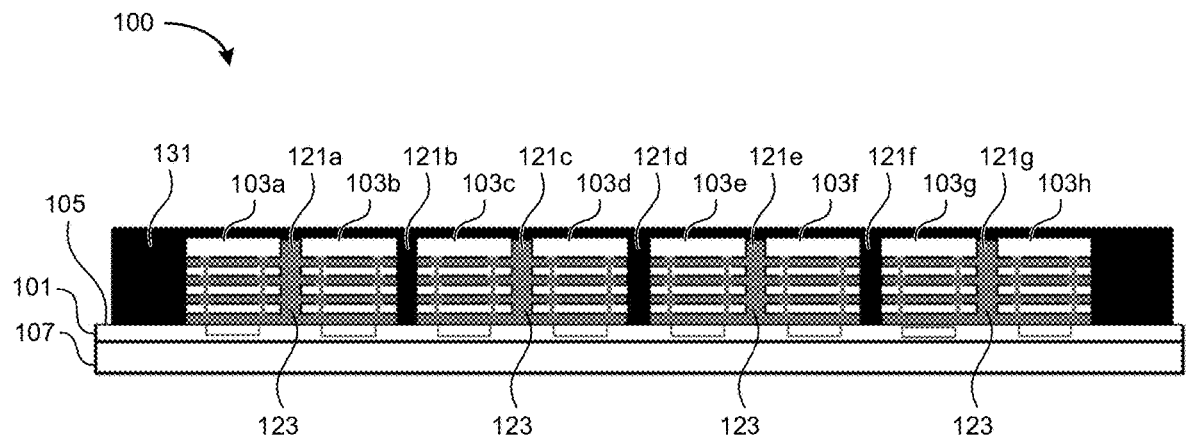

FIG. 1E is a cross-sectional view of the assembly 100 after a second sealing material 131 is deposited over the stacks 103 and the upper surface 105 of the wafer 101. The second sealing material 131 can be, for example, a mold resin material. The second sealing material 131 covers the upper surfaces 119 of the stacks 103 and fills in the second subset of gaps 121 in which the first sealing material 123 is not already present. In the illustrated embodiment, the second sealing material 131 fills in the gaps 121b, 121d, and 121f, as well as the remaining side surfaces of the stacks 103. The assembly 100 can then be annealed to cure the first and second sealing materials 123 and 131.

The first sealing material 123 and the second sealing material 131 can have different properties to achieve desired results. For example, the first sealing material 123 can have a lower filler concentration of a filler material (e.g., filler containing ratio) and/or a lower viscosity than the second sealing material 131. Furthermore, the first sealing material 123 can have a greater linear coefficient of thermal expansion (CTE) and/or a greater thermal cure shrinkage coefficient than the second sealing material 131. In some embodiments, the first sealing material 123 can be a CUF material and the second sealing material 131 can be a mold resin material. In conventional chip-on-wafer processes, CUF material is dispensed along both lines 125 and 127 (FIG. 1D), thereby filling in all the gaps between adjacent stacks. However, due to the material properties of the CUF material (e.g., low viscosity and low filler containing ratio), during subsequent annealing the curing of the CUF material can cause wafer warpage. Mold resin material, due to its distinct material properties (e.g., higher viscosity and higher filler containing ratio), is not as susceptible to causing wafer warpage during the curing process. Accordingly, by reducing the total amount of the first sealing material—such as a CUF material—provided in between the stacks of dies, wafer warpage caused by the curing process can be reduced.

Figure 1F:
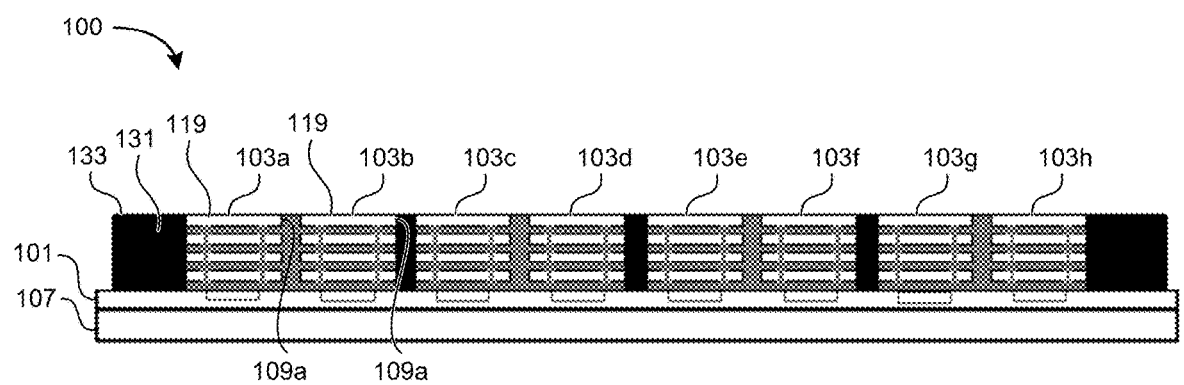

FIG. 1F is a cross-sectional view of the assembly 100 after backgrinding and planarization. For example, an upper portion of the assembly 100 shown in FIG. 1E can be removed by backgrinding followed by chemical-mechanical planarization (CMP) or another removal technique to form an upper surface 133 along the remaining second sealing material 131 that is substantially coplanar with the upper surfaces 119 of each of the stacks 103. In some embodiments, a portion of the uppermost semiconductor die 109a in each stack 103 can be removed during backgrinding and CMP.

Figure 1G:
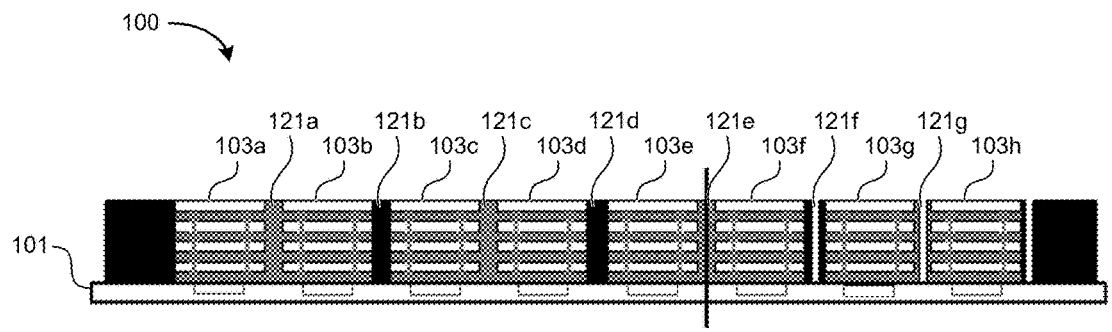
Figure 1H:
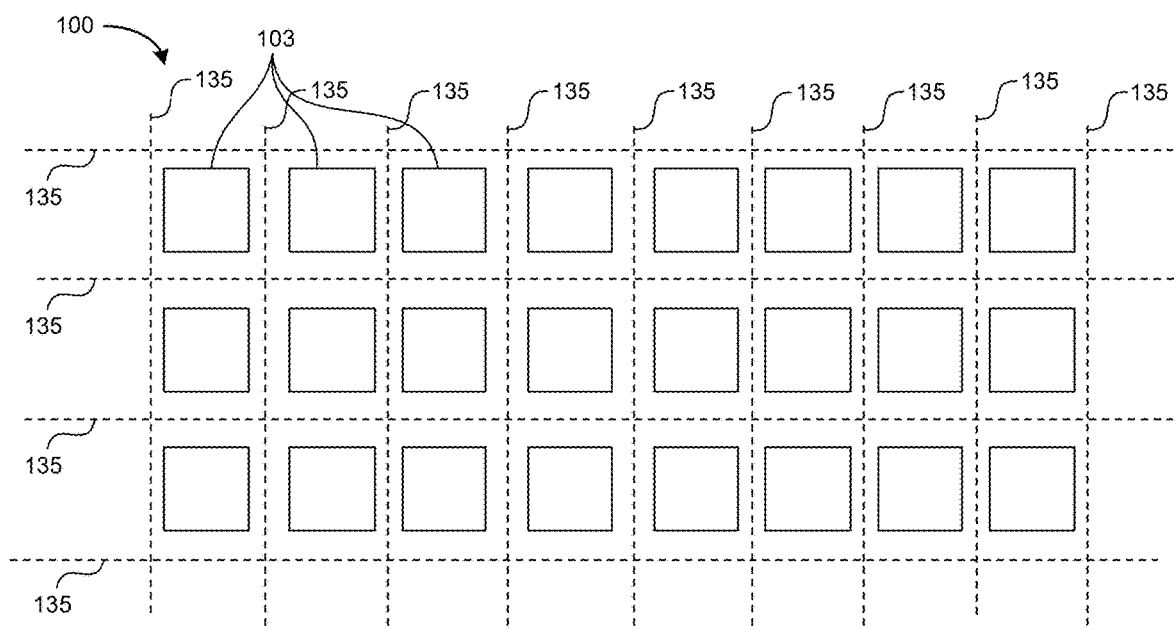

FIG. 1G is a cross-sectional view of the assembly 100 after removal of the support substrate 107 and singulation of some of the stacks 103. FIG. 1H is a top plan view of a portion of the assembly 100 after singulation of the stacks 103. Referring to FIGS. 1G and 1H together, the support substrate 107 is removed from the wafer 101 and placed on a tape (not shown) and then a wafer saw or other technique is used to dice the wafer 101 along the gaps 121 as indicated by lines 135 to singulate the individual stacks 103. The stacks 103 can then be separately mounted into other assemblies as described in more detail below.

Figure 2A:
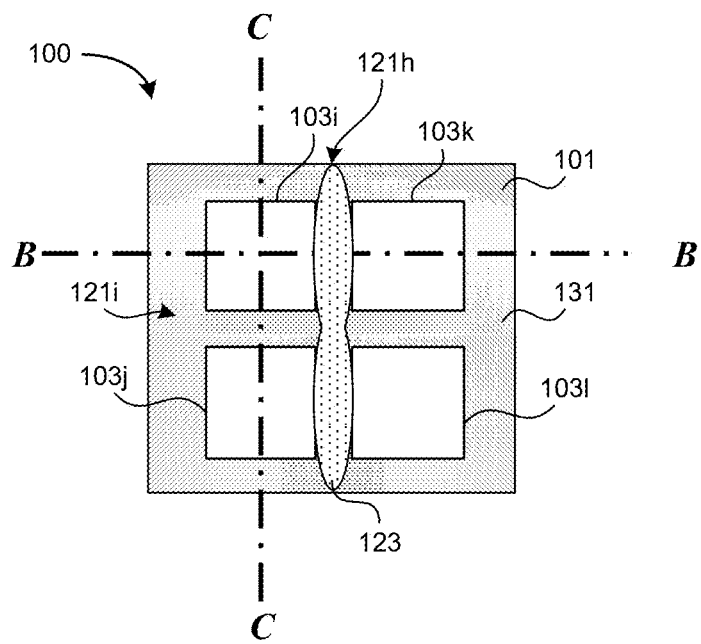
FIG. 2A is a top plan view of a portion of the assembly of FIG. 1H before singulating the stacks of semiconductor dies.
Figure 2B:
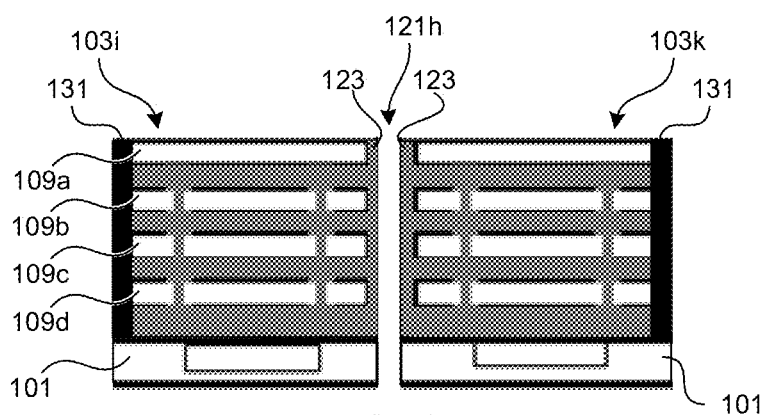
FIG. 2B is a cross-sectional view of the portion of the assembly of FIG. 2A taken along line B-B.
Figure 2C:
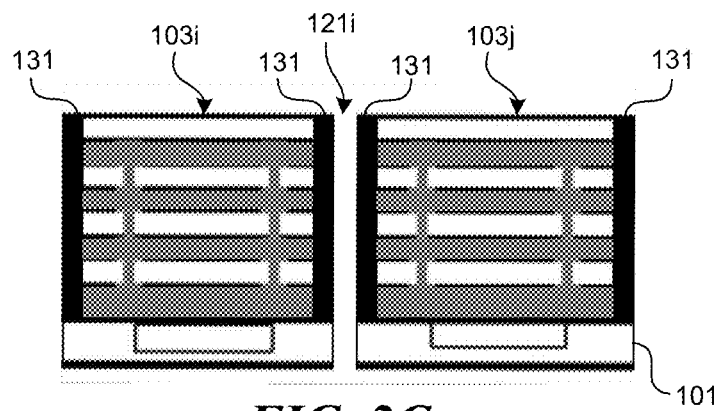
FIG. 2C is a cross-sectional view of the portion of the assembly of FIG. 2A taken along line C-C.

FIG. 2A is a top plan view of a portion of the assembly 100 of FIG. 1H before singulating the stacked semiconductor dies. Four individual stacks 103i-l are arranged in an array over the wafer 101. The first sealing material 123 is disposed in the gap 121h that separates the left stacks 103i and 103j from the right stacks 103k and 103l. The second sealing material 131 is disposed in the gap 121i that separates the upper stacks 103i and 103k from the lower stacks 103j and 103l, and further surrounds the remaining sides of the stacks 103i-l. The assembly 100 is diced to singulate the stacks 103i-l, including dicing along the gaps 121h and 121i. FIG. 2B is a cross-sectional view of the portion of the assembly 100 of FIG. 2A taken along line B-B after singulating the stacks 103, and FIG. 2C is a cross-sectional view of the portion of the assembly 100 of FIG. 2A taken along line C-C after singulating the stacks 103. Referring to FIGS. 2B and 2C together, after singulation each of the stacks 103i-l has four sides. Of the four sides, the first sealing material 123 is disposed over one of the sides and the second sealing material 131 is disposed over the remaining three of the four sides. In particular, the side of each of the stacks 103i-h that faces towards the gap 121h is, after singulation, covered by the first sealing material 123. The first sealing material 123 also fills in the areas between individual semiconductor dies 109 of the individual stacks 103.

The particular configuration of the stacks 103i-l can reduce the risk of wafer warpage during the curing process. As noted above, each of the stacks 103i-l has one side covered with the first sealing material 123 and the remaining three sides covered with the second sealing material 131. The first sealing material 123 can have material properties that contribute more to wafer warpage than the second sealing material 131. For example, the first sealing material 123 can have a lower filler containing ratio, a lower viscosity, a greater linear coefficient of thermal expansion, and/or a greater thermal cure shrinkage coefficient than the second sealing material 131. Accordingly, by covering only one side of the stacks 103i-l with the first sealing material 123 and the covering the remaining three sides with the second sealing material 131, the overall amount of the first sealing material 123 is reduced and there is correspondingly a lower likelihood of wafer warpage during the curing process.

Figure 3A:
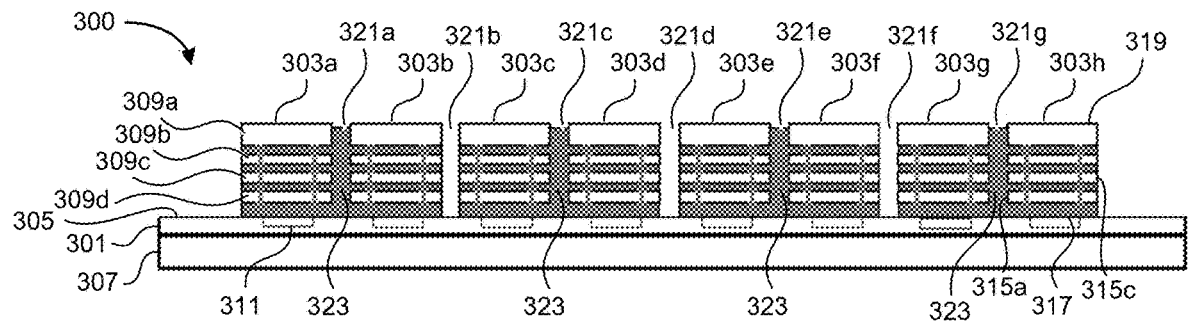
FIGS. 3A-3D are cross-sectional views of an assembly comprising a wafer having a plurality of stacks of semiconductor dies thereon at various stages of processing in accordance with another embodiment of the present technology.
Figure 3B:
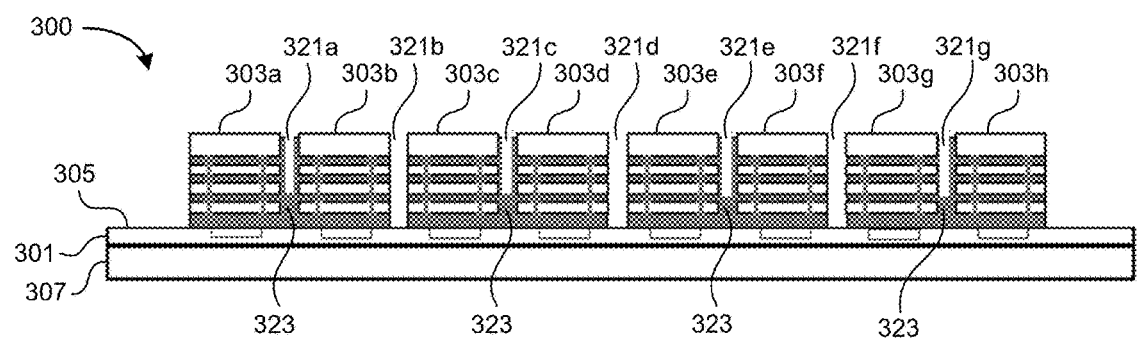
Figure 3C:
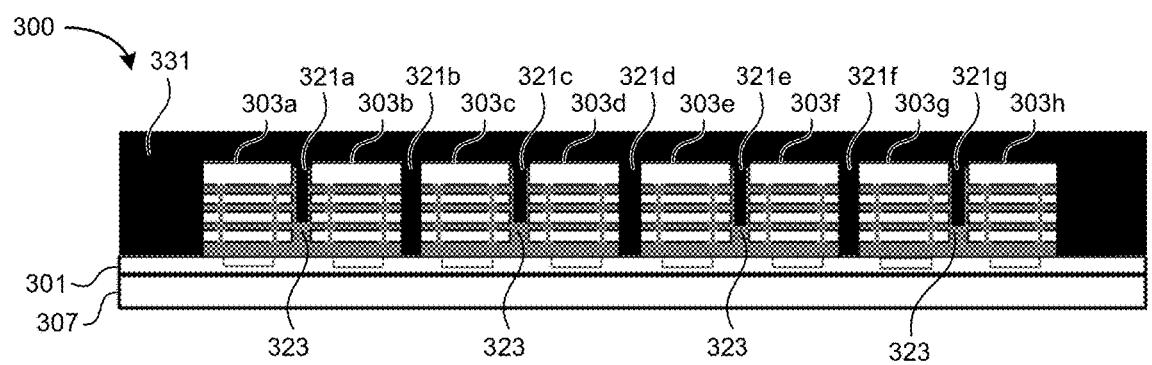

FIGS. 3A-3C are cross-sectional and top plan views of an assembly 300 comprising a wafer 301 having a plurality of stacks 303 (identified individually by reference numbers 303a-h) of semiconductor dies thereon at various stages of processing in accordance with another embodiment of the present technology. FIG. 3A illustrates an assembly 300 that can be substantially similar to the assembly 100 at the point of processing shown in FIG. 1D. For example, the stacks 303 are disposed in an array across the upper surface 305 of the wafer 301. The wafer 301 is disposed over and supported by a support substrate 307. In the illustrated embodiment, each individual stack 303 includes four semiconductor dies 309a-d stacked vertically on top of one another and the four semiconductor dies 309a-d are stacked over a logic circuit 311 formed in or on the wafer 301.

Each stack 303 defines a substantially rectangular geometric prism having side surfaces 315a and 315c, a lower surface 317 adjacent to the logic circuit 311, and an upper surface 319 opposite the lower surface 317. Adjacent stacks 303 are laterally separated by a plurality of gaps 321a-g (collectively gaps 321). The assembly 300 also includes a first sealing material 323 in a first subset of the gaps 321a-g between adjacent stacks 303, but not in a second subset of the gaps 321a-g. In the illustrated embodiment, the first sealing material 323 fills a first subset of the gaps 321 including gaps 321a, 321c, 321e, and 321g. The first sealing material 323 is absent from a second subset of the gaps 321 including gaps 321b, 321d, and 321f.

FIG. 3B is a cross-sectional view of the assembly 300 after portions of the first sealing material 323 have been removed from the first subset of gaps 321. In the illustrated embodiment, a wafer saw can be used to remove portions of the first sealing material 323 from the gaps 321a, 321c, 321e, and 321g into which it has been dispensed. In some embodiments, at least 25% of the first sealing material 323 can be removed from the select gaps 321. In some embodiments, at least 50%, at least 75%, or more of the first sealing material 323 can be removed from the select gaps 321 using a wafer saw or other technique.

FIG. 3C is a cross-sectional view of the assembly 300 after a second sealing material 331 is deposited over the stacks 303 and into each of the gaps 321, similar to the process described above with respect to FIG. 1E. The second sealing material 331 fills both the first subset of gaps 321a, 321c, 321e, and 321g in which there is no first sealing material 323 present and the second subset of gaps 321b, 321d, and 321f which are partially filled with the first sealing material 323. The assembly 300 can then be annealed to cure the first and second sealing materials 323 and 331.

Figure 3D:
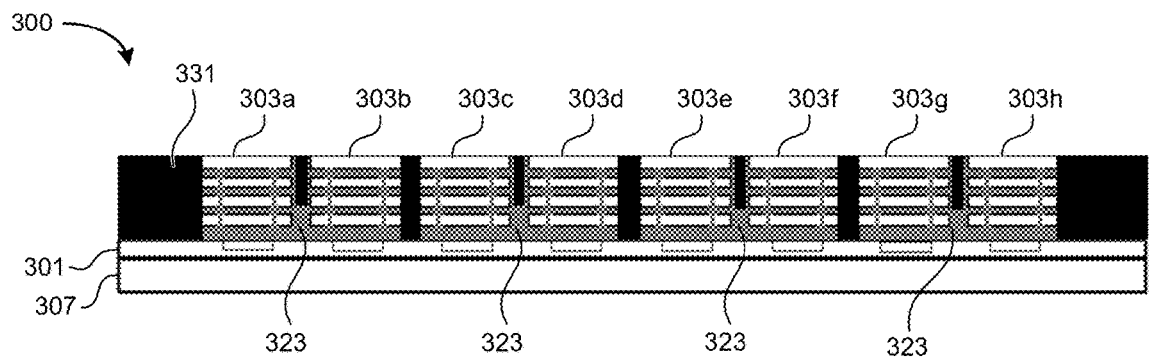

FIG. 3D is a cross-sectional view of the assembly 300 after an upper portion the second sealing material 331 shown in FIG. 3C is partially removed by backgrinding and planarization until it is coplanar with the stacks 303, similar to the process described above with respect to FIG. 1F. Following backgrinding and planarization, the support substrate 307 can be removed, the wafer 301 attached to tape, and the individual stacks 303 singulated using a wafer saw or other technique.

Figure 4A:
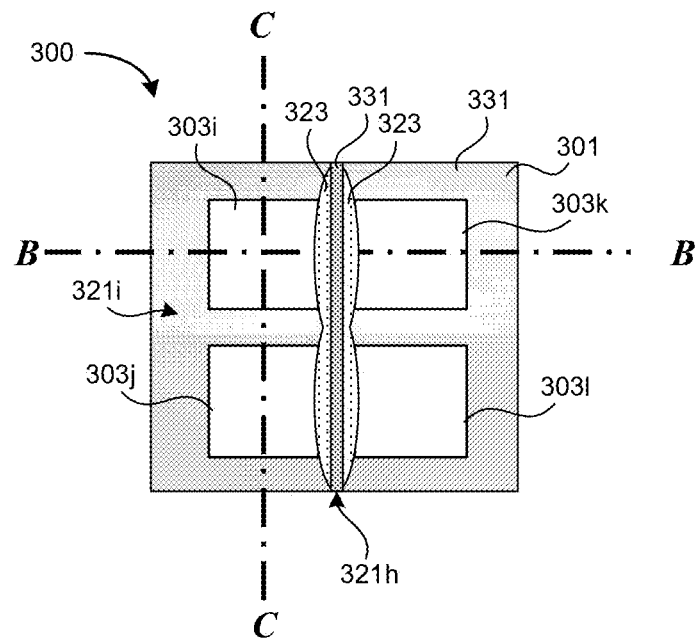
FIG. 4A is a top plan view of a portion of the assembly of FIG. 3D after singulating the stacks of semiconductor dies.
Figure 4B:
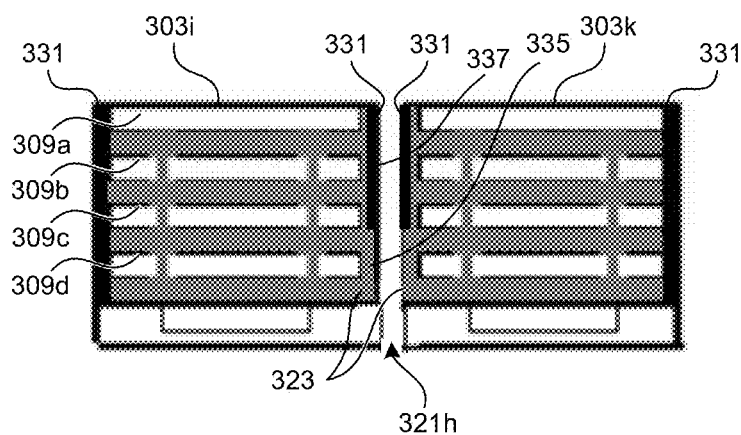
FIG. 4B is a cross-sectional view of the portion of the assembly of FIG. 4A taken along line B-B.
Figure 4C:
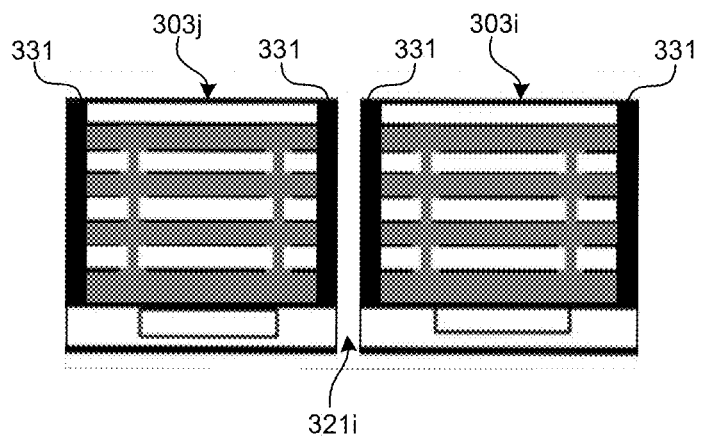
FIG. 4C is a cross-sectional view of the portion of the assembly of FIG. 4A taken along line C-C.

FIG. 4A is a top plan view of a portion of the assembly 300 of FIG. 3D. Four individual stacks 303i-l are arranged in an array over the wafer 301. The first sealing material 323 is in the gap 321h that separates the left stacks 303i and 303j from the right stacks 303k and 303l. The second sealing material 331 is also in the gap 321h on top of the first sealing material 323 in addition to being in the gap 321i separating the upper stacks 303i and 303k from the lower stacks 303j and 303l. The second sealing material 331 further surrounds the remaining sides of the stacks 303i-l. The assembly 300 is diced to singulate the stacks 303i-l, including dicing along the gaps 321h and 321i. FIG. 4B is a cross-sectional view of the portion of the assembly 300 of FIG. 4A taken along line B-B after singulating the stacks 303, and FIG. 4C is a cross-sectional view of the portion of the assembly 300 of FIG. 4A taken along line C-C after singulating the stacks 303. Referring to FIGS. 4B and 4C together, after singulation each of the stacks 303i-l has four sides. Of the four sides, the second sealing material is disposed completely over three of the four sides. With respect to the remaining side of each stack 303, it is partially covered by the first sealing material 323 and partially covered by the second sealing material 331. For example, the side of stack 303i facing the gap 321h has a lower portion 335 that is covered with the first sealing material 323 and an upper portion 337 that is covered with the second sealing material 331. The first sealing material 323 also fills in the areas between individual semiconductor dies 309 of the individual stacks 303.

Figure 5:
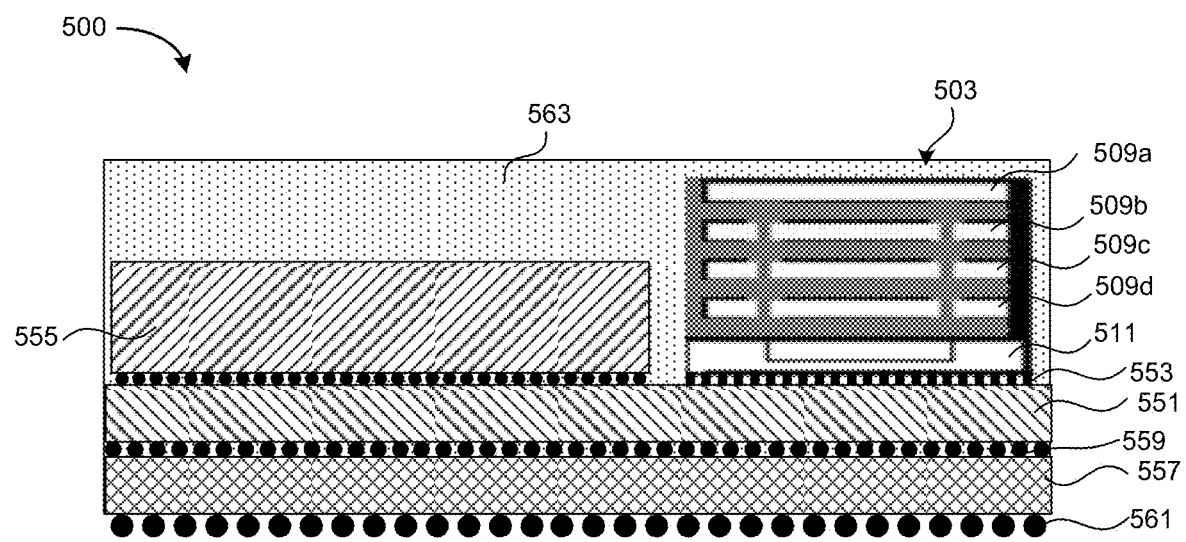
FIG. 5 is a cross-sectional view of a larger device assembly incorporating a singulated stack of dies therein.

FIG. 5 is a cross-sectional view of a singulated stack 503 of dies integrated into a larger device assembly 500. As illustrated, the stack 503 includes multiple memory dies 509a-d disposed over an input/output die 511. The stack 503 is mounted over an interposer substrate 551, for example via micropillars 553, with an adjacent system-on-chip 555 spaced laterally adjacent to the stack 503 and also mounted over the interposer substrate 551. The interposer substrate 551, in turn, is mounted to a package substrate 557 via solder balls 559. The package substrate 557 includes a plurality of package solder balls 561 for electrical and mechanical connection between the package substrate 557 and another system. For example, the assembly 500 can be mounted to a PCB or other surface. A third sealing material 563, such as an encapsulant, is disposed over and seals the stack 503 as well as the system-on-chip 555.

Figure 6:
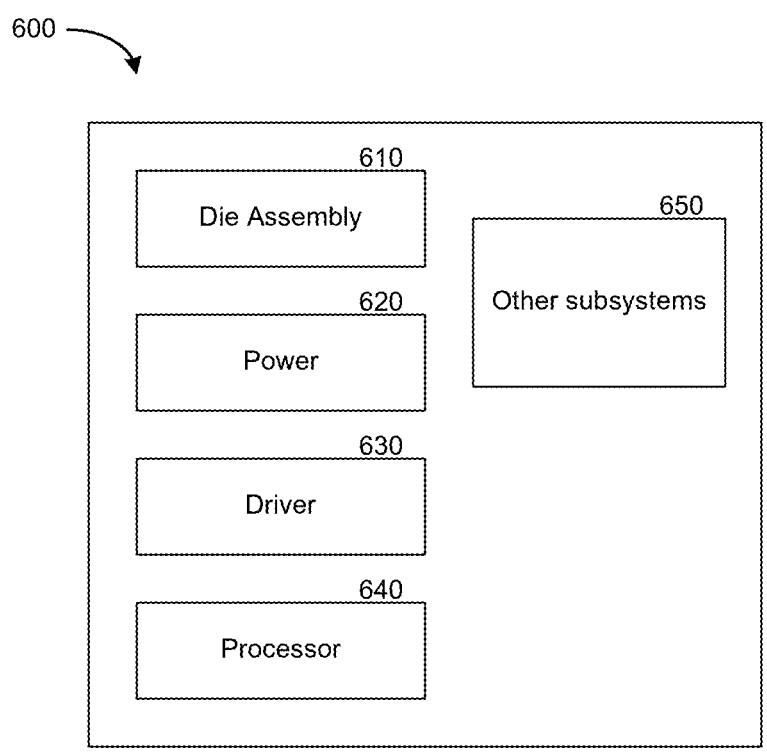
FIG. 6 is a schematic view of a system that includes a stacked semiconductor die assembly configured in accordance with embodiments of the present technology.

Any one of the stacks of dies described above with reference to FIGS. 1-5 can be incorporated into any of a myriad of larger and/or more complex systems, a representative example of which is system 600 shown schematically in FIG. 6. The system 600 can include a stacked semiconductor die assembly 610, a power source 620, a driver 630, a processor 640, and/or other subsystems or components 650. The stacked semiconductor die assembly 610 can include features generally similar to those of the stacked die assemblies described above, and can therefore include one or more sides at least partially covered with a first sealing material and other sides covered with a second sealing material. The resulting system 600 can perform any of a wide variety of functions, such as memory storage, data processing, and/or other suitable functions. Accordingly, representative systems 600 can include, without limitation, hand-held devices (e.g., mobile phones, tablets, digital readers, and digital audio players), computers, and appliances. Components of the system 600 may be housed in a single unit or distributed over multiple, interconnected units (e.g., through a communications network). The components of the system 600 can also include remote devices and any of a wide variety of computer-readable media.

From the foregoing, it will be appreciated that specific embodiments of the invention have been described herein for purposes of illustration, but that various modifications may be made without deviating from the disclosure. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A semiconductor device comprising:
a first chip including a first plurality of side surfaces;
a second chip including a second plurality of side surfaces, the second chip being stacked with the first chip;
a first sealing material provided in direct contact with a first one of the first plurality of side surfaces of the first chip and filling a space between the first chip and the second chip; and
a second sealing material provided in direct contact with a remaining one or ones of the first plurality of side surfaces of the first chip and in direct contact with the plurality of side surfaces of the second chip, the second sealing material being different from the first sealing material.

2. The semiconductor device according to claim 1 wherein the first sealing material has a first filler containing ratio and the second sealing material has a second filler containing ratio that is larger than the first filler containing ratio.

3. The semiconductor device according to claim 1 wherein the second sealing material does not occupy the space between the first chip and the second chip and is in contact with the first sealing material.

4. The semiconductor device according to claim 1, further comprising an interface chip stacked with the first chip, and wherein each of the first and the second chips comprises a memory chip.

5. The semiconductor device according to claim 4, further comprising a third sealing material provided in contact with each of the side surfaces of the interface chip and with the first and the second sealing materials.

6. A semiconductor device comprising:
a stack of a plurality of semiconductor dies, each of the plurality of semiconductor dies having a plurality of side surfaces;
a first sealing material disposed directly on one of the plurality of side surfaces of a first one of the plurality of semiconductor dies and extending between each adjacent pair of dies of the stack; and
a second sealing material disposed directly on another one of the plurality of side surfaces of the first one of the plurality of semiconductor dies, the second sealing material having a lower thermal cure shrinkage coefficient than the first sealing material.

7. The semiconductor device of claim 6 wherein the first sealing material has a lower filler containing ratio than the second sealing material.

8. The semiconductor device of claim 6 wherein the stack of the plurality of semiconductor dies includes an interface chip and a memory chip.

9. The semiconductor device of claim 6, wherein the first sealing material comprises a capillary under fill (CUF) material and the second sealing material comprises a mold resin material.

* * * * *